United States Patent
Sahota et al.

[19]

[11] Patent Number: 6,133,619
[45] Date of Patent: Oct. 17, 2000

[54] REDUCTION OF SILICON OXYNITRIDE FILM DELAMINATION IN INTEGRATED CIRCUIT INTER-LEVEL DIELECTRICS

[75] Inventors: Kashmir Sahota, Fremont; Richard J. Huang, Cupertino; David Matsumoto, Los Altos; Mark T. Ramsbey, Sunnyvale; Yu Sun, Saratoga; Judith Quan Rizzuto, Los Gatos, all of Calif.

[73] Assignee: Advanced Micro Devices, Inc., Sunnyvale, Calif.

[21] Appl. No.: 09/144,521

[22] Filed: Aug. 31, 1998

[51] Int. Cl.[7] ................................................. H01L 51/00
[52] U.S. Cl. ...................... 257/649; 257/642; 257/637; 257/759; 257/760; 257/774; 257/758
[58] Field of Search ................................ 257/642, 637, 257/759, 760, 774, 758, 649

[56] References Cited

U.S. PATENT DOCUMENTS 5,470,802  11/1995  Gnade et al. ........................... 438/781
5,661,344  8/1997   Havemann et al. ..................... 257/758
5,747,880  5/1998   Havemann et al. ..................... 257/760
5,818,111  10/1998  Jeng et al. ............................... 257/758

*Primary Examiner*—Fetsum Abraham

[57] ABSTRACT

Outgassing from a dielectric gap fill layer, e.g., a low dielectric constant material such as HSQ, and attendant deformation or delamination of a barrier dielectric layer on an overlying patterned conductive layer during subsequent thermal processing are avoided or significantly reduced by controlling the thickness of the dielectric cap layer on the dielectric gap fill layer. Embodiments include depositing a conformal SiON barrier on a first conductive pattern, depositing a HSQ gap fill layer on the conformal SiON barrier layer, depositing a silicon oxide cap layer and planarizing such that the thickness of the planarized silicon cap layer is at least 2500 Å, thereby avoiding deformation and/or delamination of a conformal SiON barrier layer on an overlying patterned conductive layer during subsequent thermal processing.

6 Claims, 6 Drawing Sheets

REDUCTION OF SILICON OXYNITRIDE FILM DELAMINATION IN INTEGRATED CIRCUIT INTER-LEVEL DIELECTRICS

RELATED APPLICATION

This application contains subject matter related to subject matter disclosed in U.S patent application Ser. No. 09/144,694, entitled "SCALABLE AND RELIABLE INTEGRATED CIRCUIT INTER-LEVEL DIELECTRIC" and filed on Aug. 31, 1998, and related to subject matter disclosed in U.S. patent application Ser. No. 50,100,520, entitled "SCALABLE AND RELIABLE INTEGRATED CIRCUIT INTER-LEVEL DIELECTRIC" and filed on Aug. 31, 1998.

FIELD OF THE INVENTION

The invention relates to semiconductor devices and, more specifically, to the use of conformal silicon oxynitride films in integrated circuit inter-level dielectrics.

BACKGROUND OF THE INVENTION

Integrated circuits are typically fabricated from one or more layers of different materials. Typical integrated circuits include multiple interconnected patterned metal layers, with intervening inter-level dielectric (ILD) layers to electrically insulate the metal layers.

The selection of a specific ILD depends upon the performance, density and reliability requirements of a particular semiconductor circuit. Ideal ILDs are contamination and defect free, exhibit a low dielectric constant that approaches unity, have a sufficiently high field strength, provide a good barrier to sodium ions (Na+) and provide infinite etch selectivity to underlying materials, such as silicides, silicon and polysilicon. ILDs must also conform to different topographies, such as steps and gaps, exhibit good adhesion to the underlying and overlying layers and be capable of planarization.

Good ILD planarization characteristics become increasingly important as the number of layers in a device increases, because photolithographic processing is acutely sensitive to variations in ILD topography, particularly in accurately forming vias on uneven surfaces. However, in fabricating ultra high density semiconductor devices, which include tightly packed, high aspect ratio metal patterns, it is difficult to satisfactorily planarize a deposited dielectric material. This is particularly true when a layer of circuitry contains both relatively dense areas that contain a relatively large number of circuit components and areas such as peripheral circuit regions, that contain relatively few circuit components, wherein a step or elevation results therebetween.

A conventional approach to forming ILDs involves depositing two dielectric layers. A first dielectric gap fill layer, e.g., spin-on-glass (SOG), silicon dioxide ($SiO_2$), or other oxide, is deposited on a patterned metal layer to fill any gaps therein. Typical gap fill layers not only fill gaps in the patterned metal layer, but also form a layer on the upper surface of the underlying metal features. Then a second dielectric layer, referred to as a "cap layer," is deposited on the gap fill layer. The cap layer is then planarized (leveled), as by a chemical-mechanical polishing (CMP), to provide a substantially flat upper surface on which additional layers are formed.

ILD structures formed according to conventional methodology typically contain a reasonably flat upper surface but suffer from hot carrier injection (HCI) reliability failures. It is well recognized that HCI problems typically arise when semiconductor device dimensions are reduced while the supply voltage is maintained at the same level, thereby increasing the electric field generated in the silicon substrate. As a result, some electrons in the channel are sufficiently energized to be injected into the gate oxide, charging the gate oxide and causing long term device degradation which raises the threshold voltage of the device. Accordingly, there exists a need for high density multi-level semiconductor devices having adequately planarized ILDs with improved resistance to HCI degradation.

SUMMARY OF THE INVENTION

An advantage of the invention is a semiconductor device having an ILD with a SiON layer that is more resistant to delamination of the SiON layer.

Another advantage of the invention is a method of manufacturing a semiconductor device having an ILD with a SiON layer that reduces the likelihood that the SiON layer will delaminate.

Additional, advantages and other features of the invention will be set forth in part in the description which follows and in part will become apparent to those having ordinary skill in the art upon examination of the following description or may be learned from the practice of the invention. The advantages of the invention may be realized and obtained as particularly pointed out in the appended claims.

According to an aspect of the invention, the foregoing and other advantages are achieved in part by a semiconductor device comprising a substrate, a first dielectric layer on the substrate, a first patterned metal layer on the first dielectric layer, a second dielectric layer on the first patterned metal layer, a third dielectric layer having a thickness at least about 1000 Angstroms (Å) on the second dielectric layer, a second patterned metal layer on the third dielectric layer and a silicon oxynitride layer on the second patterned metal layer.

Another aspect of the invention is a method of manufacturing a semiconductor device. The method comprises the steps of forming a first dielectric layer on a substrate, forming a first patterned metal layer on the first dielectric layer, forming a second dielectric layer on the first patterned metal layer, forming a third dielectric layer on the first patterned metal layer, forming a third dielectric layer having a thickness of at least 1000 Å on the second dielectric layer, forming a second patterned metal layer on the third dielectric layer and forming a silicon oxynitride layer on the second patterned metal layer.

Additional advantages of the invention will become readily apparent to those skilled in the art from the following detailed description, wherein only the preferred embodiment of the invention is shown and described, simply by way of illustration of the best mode contemplated for carrying out the invention. The invention is capable of the other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Embodiments of the invention are illustrated by way of example, and not by way of limitation, in the figures of the accompanying drawings in which like reference numerals refer to similar elements and in which.

DETAILED DESCRIPTION OF THE PREFERRED EMBODIMENT

Related U.S. patent application Ser. No. 09/144,694, entitled "SCALABLE AND RELIABLE INTEGRATED CIRCUIT INTER-LEVEL DIELECTRIC" and filed on Aug. 31, 1998 [Attorney Docket No. 50100-521] describes a variation of the two dielectric layer approach that involves providing a lower barrier layer, for example, SiON, underneath the gap fill layer to reduce migration of electrons from the gap fill layer into devices contained in layers beneath the gap fill layer. This approach provides an ILD having relatively greater immunity to HCI effects than conventional ILDs.

One problem found with this approach has been deformation and/or delamination of the SiON layer. It is believed that such deformation and/or delamination of conformal SiON layers is attributable to outgassing of gap fill layer materials, such as hydrogen silsesquioxane (HSQ), during subsequent normal processing, e.g., at temperatures of at least about 300° C.

Figure 1:
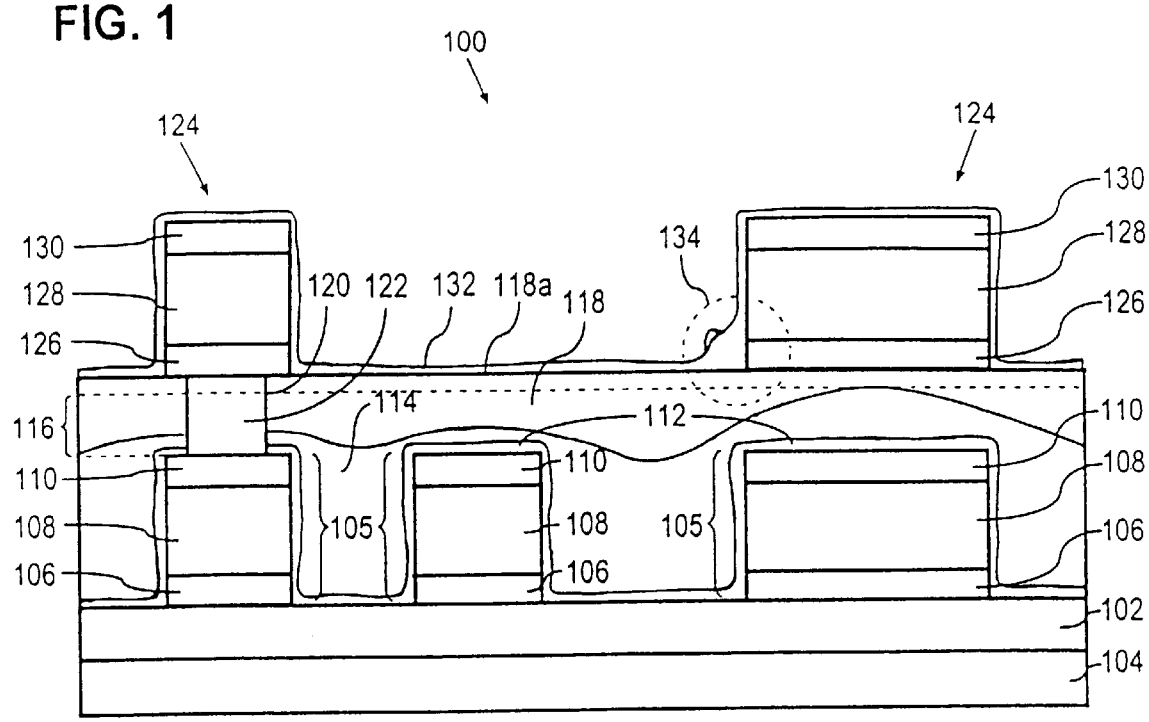
FIG. 1 schematically illustrates an integrated circuit and delamination of a SiON film.

For example, FIG. 1 illustrates a conventional integrated circuit structure designated by the reference numeral 100, and comprising a dielectric layer 102, typically silicon dioxide($SiO_2$), formed on a substrate 104, typically doped monocrystalline silicon (Si). A first patterned metal layer comprising one or more metal features or "stacks" 105 with gaps therebetween, is formed on dielectric layer 102. The first patterned metal layer is often referred to as "metal 1." Conventional metal stacks 105 comprise a lower barrier layer 106, typically titanium (Ti), an intermediate primary conductive layer 108, typically aluminum (Al), on barrier layer 106, and an upper anti-reflective coating (ARC) 110, typically titanium-nitride (TiN), on conductive layer 108. Barrier layer 106 and ARC 110 tend to reduce electromigration in conductive layer 108, albeit at the cost of increasing sheet resistance. The total height of metal stacks 105 varies depending upon the particular application, but is typically about one micron.

Once metal stacks 105 have been formed, a lower conformal barrier layer 112, typically SiON, is formed on dielectric layer 102 and ARC 110. The thickness of SiON layer 112 is typically selected so that SiON layer 112 is a relatively thin film that conforms to the shape of dielectric layer 102 and ARC 110. Once SiON layer 112 has been formed, a dielectric gap fill layer 114, such as $SiO_2$, is deposited on SiON layer 112 to insulate metal stacks 105 from each other. Gap fill layer 114 characteristically includes material on top of SiON layer 112 and metal stacks 105 whose height 116 above the upper surface of ARC 110 varies depending upon the width of metal stacks 105 and the particular process employed to deposit gap fill layer 114.

Once gap fill layer 114 has been formed, a cap layer 118 is deposited on gap fill layer 114. Cap layer 118 typically has a thickness of about 1.2 to about 1.8 microns. The upper surface 118a of cap layer 118 is not flat when cap layer 118 is deposited, but instead generally conforms to the shape of gap fill layer 114. Cap layer 118 is then planarized as by CMP, so its upper surface 118a is substantially flat. The planarization of cap layer 118 typically removes about 0.2 to about 0.8 microns of dielectric material, leaving a cap layer 118 having a thickness of about one micron or about 10,000 Å.

After upper surface 118a is planarized, a through-hole 120 is formed in cap layer 118, gap fill layer 114 and SiON layer 112, and then filled with a conductive material, e.g. tungsten (W), which is planarized, typically by chemical-mechanical polish (CMP), to form a conductive via 122.

A second patterned metal layer comprising one or more metal stacks 124 with gaps therebetween, is formed on upper surface 118a and conductive via 122. As with metal stacks 105, metal stacks 124 comprise a lower barrier layer 126, typically Ti, an intermediate primary conductive layer 128, typically Al, on lower barrier layer 126 and an ARC 130, typically TiN, a conductive layer 128. Metal stacks 124 are electrically insulated from metal stacks 105 by gap fill layer 114 and cap layer 118, except where conductive via 122 electrically connects metal stacks 124 and 105.

After the second patterned metal layer is formed on upper surface 118a and conductive via 122, a conformal SiON layer 132 is formed on cap layer 118 and metal stacks 124. During subsequent thermal cycles, for example during curing of gap fill layer 114, cap layer 118 or some other subsequent layer, e.g. metal stacks 124, gap fill layer 114 material, for example HSQ, tends to "outgas" through thin sections of cap layer 118, causing SiON layer 132 to deform, for example bubble, and in extreme circumstances, delaminate from the cap layer 118. In the present example, the outgassing of gap fill layer 114, as illustrated in region 134, is attributable to the relatively close proximity of gap fill layer 114 to SiON layer 132 at region 134.

The phenomenon responsible for this problem is believed to be the presence of pinholes or cracks in cap layer 118 near region 134 that allow gap fill layer 114 to outgas at region 134. Although cap layers typically contain pinholes and cracks, cap layers are usually thick enough to prevent outgassing. However, as illustrated in the present example, where two vertically adjacent metal layers include vertically aligned structures, namely metal stacks 105 and 124, the formation of the upper metal layer, namely metal stack 124, which typically involves etching of cap layer 118 during overetch of metal etch process, removes a portion of cap layer 118 leaving only a few hundred angstroms of material between gap fill layer 114 and overlying conformal layer 132. This problem is most acute at locations over relatively wide metal structures where more gap fill material is deposited and cap layer 118 is thinnest.

Although this problem is illustrated in FIG. 1 and described in the context of an integrated circuit having two metal layers, the problem can exist in integrated circuits having more than two metal layers. In addition, the problem can occur in integrated circuits that do not include a SiON layer on the first patterned metal layer, namely SiON layer 112. It should also be noted, that the SiON delamination problems discussed above can occur in integrated circuits where the first patterned metal layer is a built up structure, as illustrated in FIG. 1, and the second patterned metal layer is formed using damascene techniques.

In accordance with the invention, an integrated circuit having an ILD comprising a cap layer formed on a gap fill layer includes a lower barrier layer of SiON disposed under the ILD gap fill layer to provide enhanced immunity HCI effects associated with the ILD. The cap layer is formed at an initial thickness such that, after subsequent processing including planarizing, the final thickness of the cap layer is sufficient to reduce deformation or delamination of another SiON layer formed on the cap layer during subsequent thermal processing. This approach provides an integrated circuit having an ILD with enhanced immunity to HCI effects with reduced SiON delamination problems.

Figure 2:
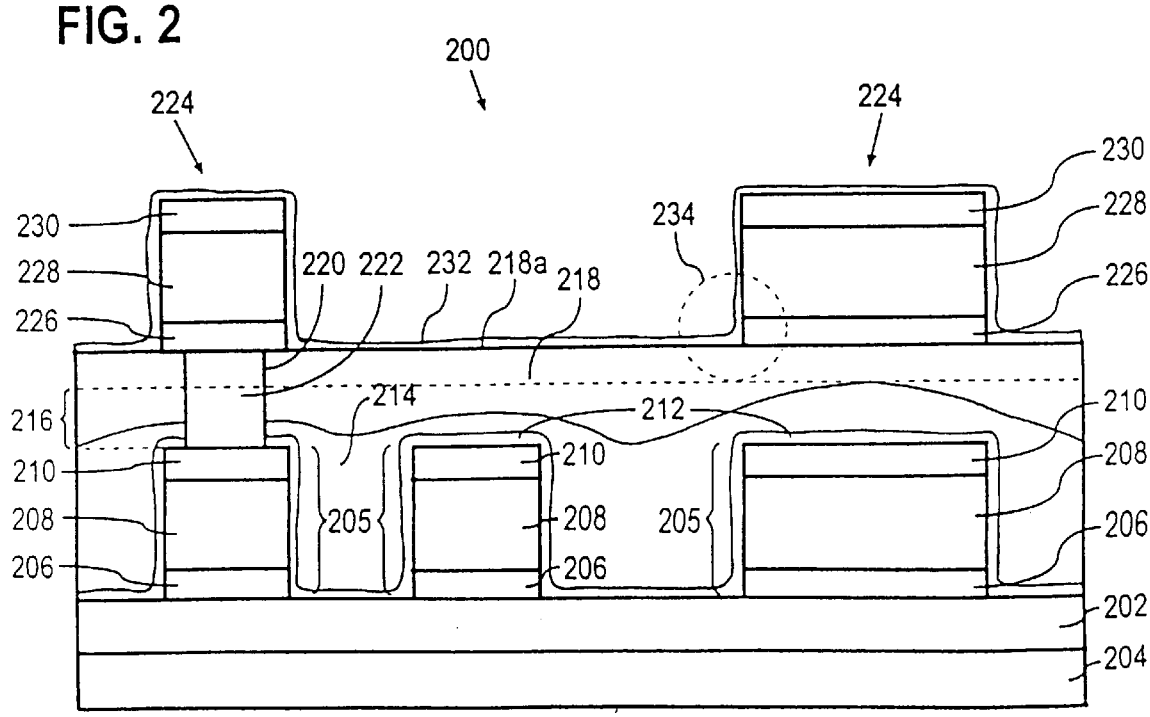
FIG. 2 schematically illustrates an integrated circuit having an ILD with a SiON film formed in accordance with an embodiment of the invention.

FIG. 2 schematically illustrates a semiconductor circuit 200 having an ILD with a SiON film formed in accordance with an embodiment of the invention. Semiconductor circuit 200 includes a dielectric layer 202 formed on a substrate 204. A first patterned metal layer comprising one or more metal stacks 205 is formed on dielectric layer 202. Metal stacks 205 include a barrier layer 206, typically of Ti or W, an intermediate primary conductive layer 208, typically Al, and an ARC 210, typically Ti/TiN. Metal stacks 205 are typically patterned to form metal lines.

A first lower barrier layer 212 comprising SiON is deposited on and substantially covering metal stacks 205 and dielectric layer 202. First lower barrier layer 212 may be selectively deposited to cover particular portions of metal stacks 205 and dielectric layer 202, or may be globally deposited to completely cover metal stacks 205 and dielectric layer 202. In addition, as illustrated on FIG. 2, first lower barrier layer 212 may be relatively thinner than metal stacks 205 and dielectric layer 202. Thus, first lower barrier layer 212 includes gaps in between metal stacks 205. Alternatively, first lower barrier layer 212 may be made thicker to partially or completely fill the gaps between metal stacks 205. One particular SiON found to be suitable is $SiO_3N_4$.

Circuit 200 includes a dielectric gap fill layer 214, e.g., SOG, $SiO_2$ or hydrogen silsesquioxane (HSQ), formed on dielectric layer 202 and ARC 210. Other low dielectric constant materials may be used for gap fill layer 214, for example, FLARE or SiLK. The height 216 of gap fill layer 214 on top of metal stacks 205 generally depends upon the size of metal stacks 205 and the particular process used to deposit gap fill layer 214. For example, for relatively wide metal structures, gap fill layer 214 has a thickness of about 3500 Å. On the other hand, for relatively small metal features, such as thin metal lines, the thickness of gap fill layer 214 on top of metal stacks 205 is about 200 Å to about 500 Å.

Circuit 200 also includes a cap layer 218 formed on gap fill layer 212. Cap layer 218 may be the same dielectric material as gap fill layer 212 or may be a different dielectric material. Cap layer 218 is then planarized, such as by chemical-mechanical polish (CMP), to provide a relatively flat and smooth top surface 218a.

A through-hole 220 is formed in cap layer 218, gap fill layer 214 and SiON layer 212, and filled with a conductive material, e.g. W, which is planarized, typically by CMP, to provide a conductive via 222.

Circuit 200 also includes a second patterned metal layer comprising one or more metal stacks 224 formed on cap layer 218 and conductive via 222. Metal stacks 224 include a barrier layer 226, typically of Ti or W, an intermediate primary conductive layer 228, typically Al, and an ARC 230, typically Ti/TiN. Metal stacks 224 are typically patterned to form metal lines.

A second lower barrier layer 232, comprising SiON, is deposited on and substantially covering metal stacks 224 and cap layer 218. According to an embodiment of the invention, an initial thickness of cap layer 218 is selected so that after the second metal layer comprising metal stacks 224 is formed, a final thickness of cap layer 218 is sufficient to significantly reduce or altogether avoid any deformation or delamination of SiON layer 232. For example, the final thickness of cap layer 218 after formation of metal stacks 224 can be at least about 1000 Å and is ideally at least about 2000 Å vis-à-vis conventional practices wherein the underlying dielectric cap layer is planarized to a thickness of greater than about 2000 Å. The approach provides an integrated circuit with an ILD having enhanced immunity to both HCI effects and SiON delamination problems.

Figure 3A:
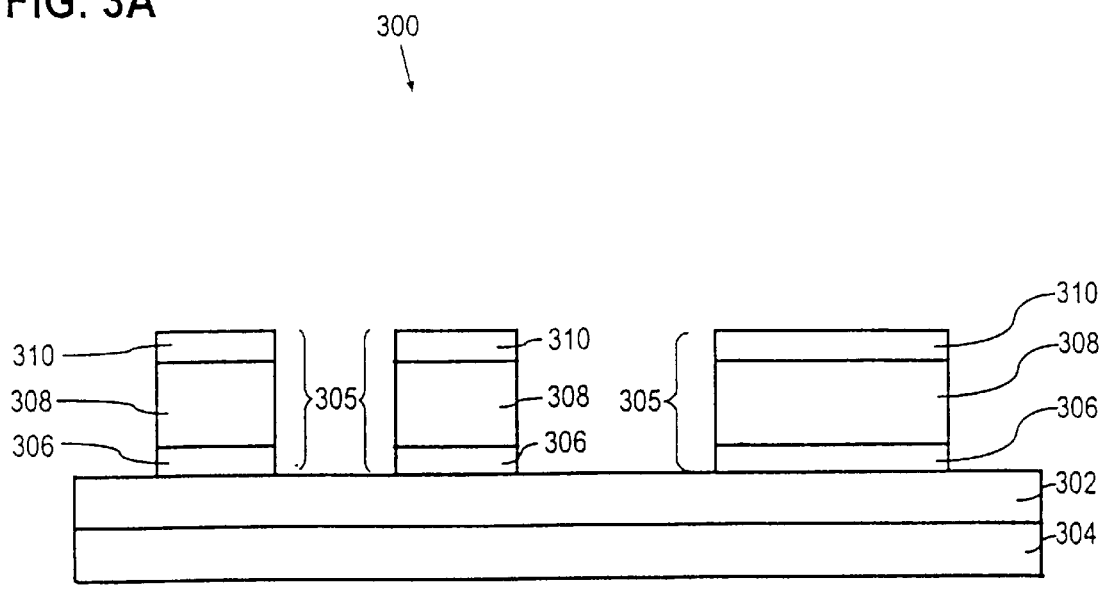
FIGS. 3A–3H illustrate relevant processing steps for manufacturing an integrated circuit having an ILD with a SiON film in accordance with an embodiment of the invention.

Sequential processing steps for forming a semicondutor circuit 300 according to an embodiment of the invention are now described with reference to FIGS. 3A–3E. Referring to FIG. 3A, metal stacks 305, having a height of about 1 micron, are formed on dielectric layer 302 which, in turn, is formed on substrate 304. Metal stacks 305 are comprised of a barrier layer 306, typically Ti deposited at a thickness of about 250 to about 500 Å, as by conventional physical vapor deposition (PVD) or chemical vapor deposition (CVD), an intermediate metal layer 308, typically Al deposited by a conventional deposition technique at a thickness of about 6000 Å to about 10000 Å, and an ARC 310, typically a Ti/TiN composite layer having a thickness in the range of about 1000 to about 1500 Å.

Figure 3B:
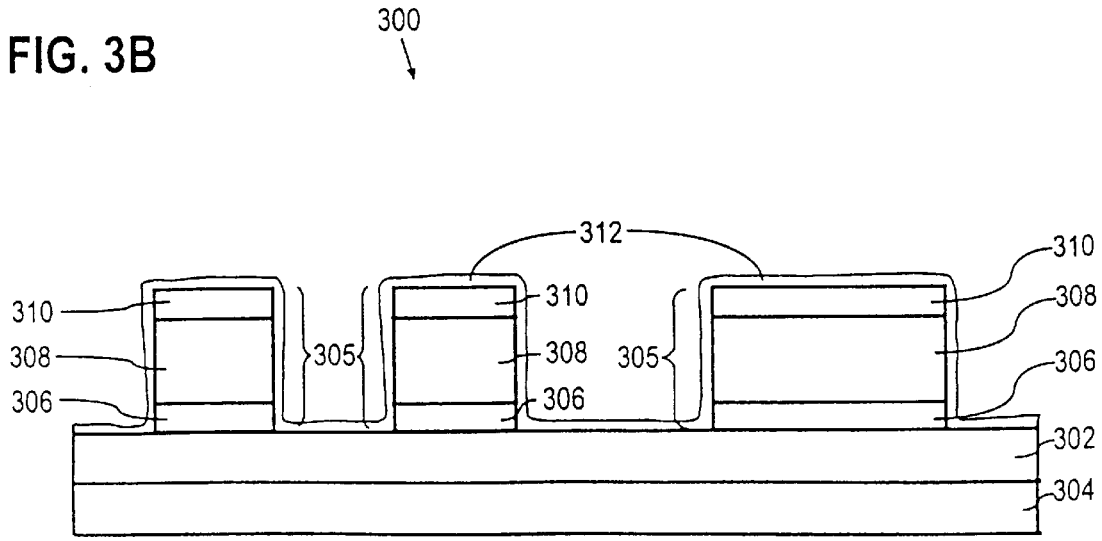

As illustrated in FIG. 3B, a lower barrier layer 312 comprising SiON is deposited on and substantially covering both metal stacks 305 and dielectric layer 302. According to an embodiment of the invention, the thickness of lower barrier layer 312 is about 500 to about 3000 Å. Ideally, lower barrier layer 312 has a thickness of about 750 to about 2000 Å.

Figure 3C:
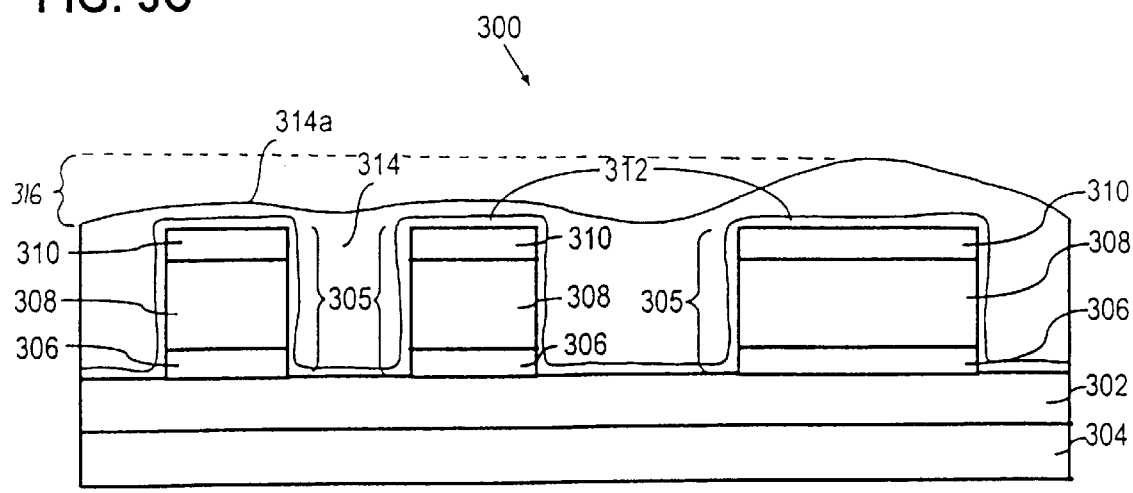

As illustrated in FIG. 3C, a gap fill layer 314 is deposited on and substantially covering lower barrier layer 312. Gap fill layer 314 is comprised of any of a variety of dielectric materials, e.g., SOG, HSQ, or other low dielectric constant materials. The top surface 314a of gap fill layer 314 is characteristically non-uniform and the height 316 above metal stacks 305 varies depending upon the width of metal stacks 305 and the particular approach used to deposit gap fill layer 314. For some types of gap fill materials, e.g. HSQ, gap fill layer 314 is then cured using conventional semiconductor processing techniques.

Figure 3D:
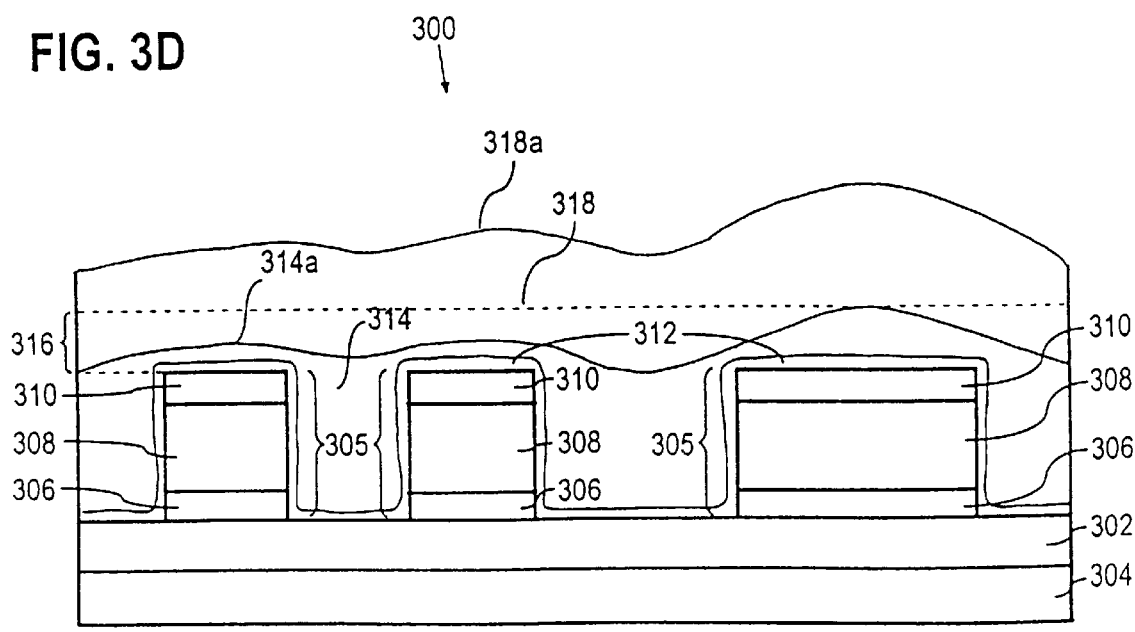
Figure 3E:
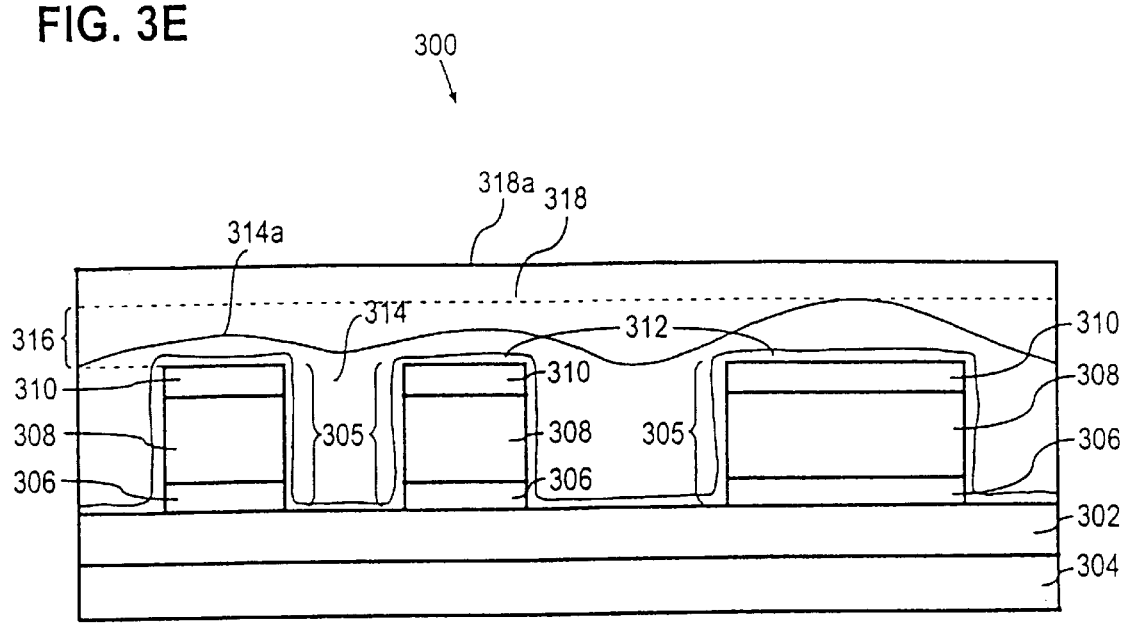

Referring to FIG. 3D, a cap layer 318, having a thickness of about one micron, is deposited on gap fill layer 314 using conventional deposition techniques. Example materials found to be suitable for cap layer 318 include silane oxide and tetraethyl orthosilicate (TEOS) oxide. According to an embodiment of the invention, the thickness of cap layer 318 is about 12,000 to about 20,000 Å. Since the upper surface 318a generally conforms to upper surface 314a of gap fill layer 314 and contains uneven topography, it is generally unsuitable for forming additional layers thereon. Accordingly, as illustrated in FIG. 3E, cap layer 318 is planarized using conventional techniques, such as CMP.

Conventional CMP provides an upper surface 318a that is flat to within about 2,000 Å. Depending upon the material selected for gap fill layer 314, it may be desirable to maintain a sufficient amount of material in cap layer 318 so that gap fill layer 314 remains completely covered after cap layer 318 is planarized. For example, some gap fill layer 314 materials, such as HSQ, tend to "outgas" and therefore need to remain covered by cap layer 318.

Figure 3F:
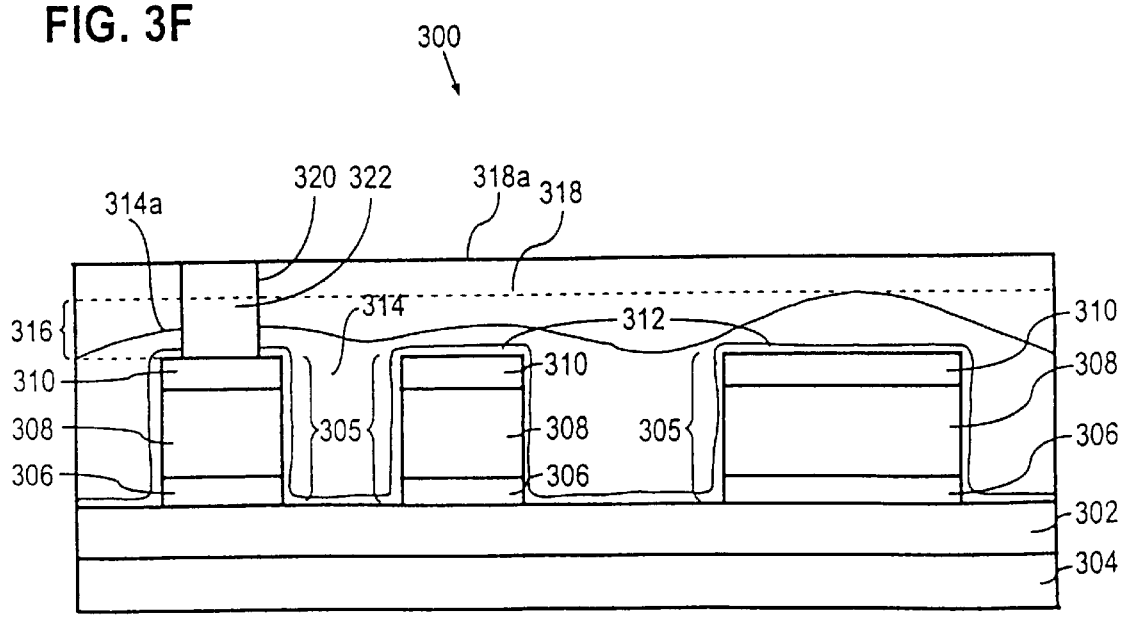

As illustrated in FIG. 3F, after upper surface 318a is planarized, a through-hole 320 is formed in cap layer 318, gap fill layer 314 and SiON layer 312, and then filled with a conductive material, e.g. W, which is planarized, typically by CMP, to form a conductive via 322.

Figure 3G:
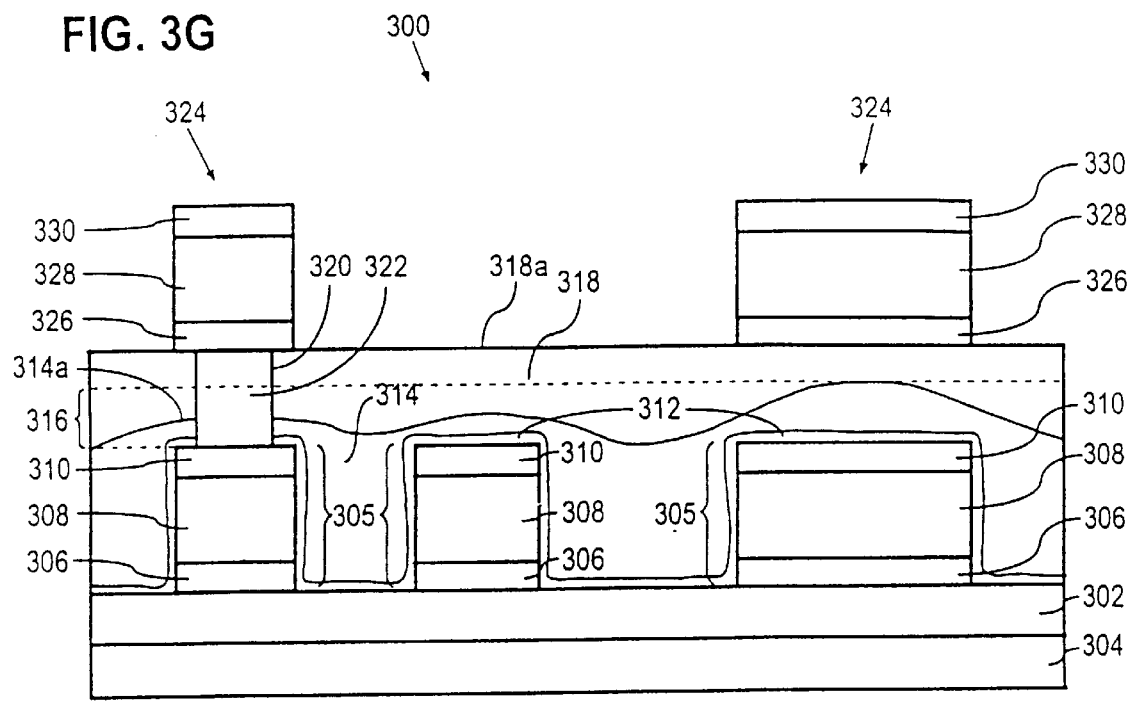

As illustrated in FIG. 3G, a second patterned metal layer comprising one or more metal stacks 324 with gaps therebetween, is formed on upper surface 318a and conductive via 322. As with metal stacks 305, metal stacks 324 comprise a lower barrier layer 326, typically Ti, an intermediate primary conductive layer 328, typically Al, on lower barrier layer 326 and an ARC 330, typically TiN, a conductive layer 328. Metal stacks 324 are electrically insulated from metal stacks 305 by gap fill layer 314 and cap layer 318, except where conductive via 312 electrically connects metal stacks 324 and 305.

Figure 3H:
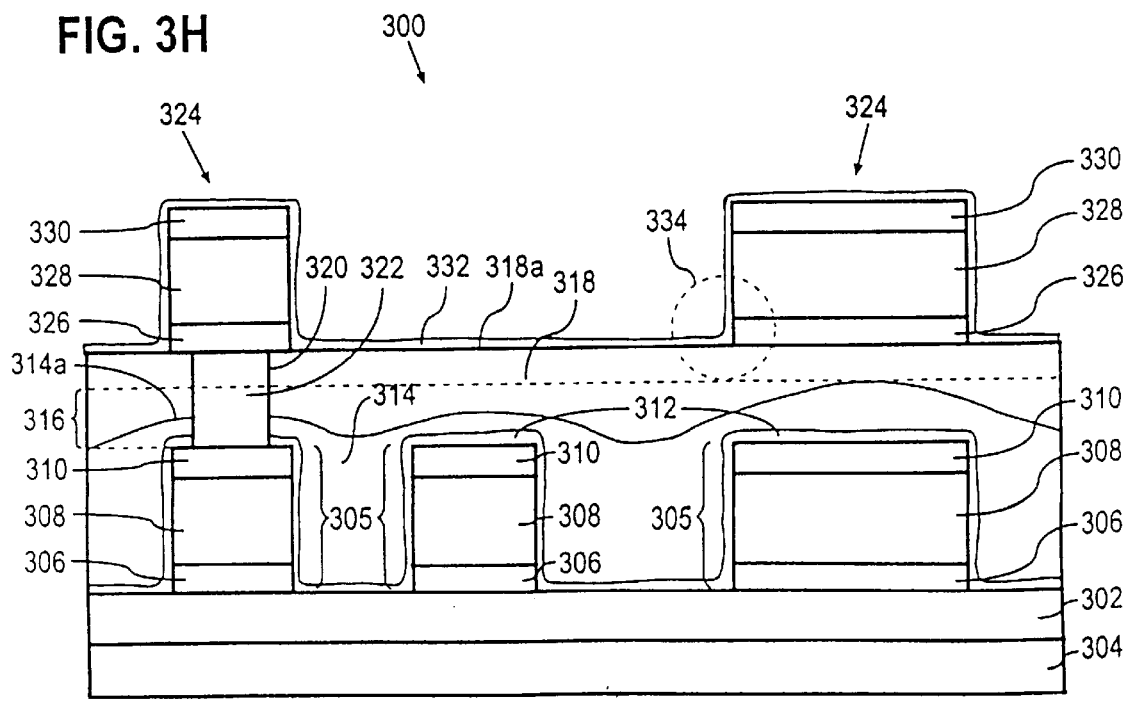

As illustrated in FIG. 3H, after the second patterned metal layer is formed on upper surface 318a and conductive via 322, a SiON layer 332 is formed on cap layer 318 and metal stacks 324. SiON layer 332 provides a lower barrier layer for dielectric layers (not illustrated) that are subsequently deposited on SiON layer 332.

As previously discussed, conventional semiconductor processing steps used to form metal stacks 324 on cap layer 318, such as etching, typically remove part of cap layer 318. Therefore, according to an embodiment of the invention, the initial thickness of cap layer 318 is selected so that after metal stacks 324 are formed on cap layer 318, the final thickness of cap layer 318 is at least about 1000 Å and is ideally at least about 2000 Å, e.g., about 2500 Å and greater. It has been determined that when cap layer 318 is formed at a sufficient thickness, SiON layer 332, particularly in region 334, is significantly more resistant to deformation and delamination during subsequent thermal process steps. When gap fill layer 314 is a material such as HSQ that is particularly prone to outgas during subsequent thermal steps, an ILD structure that includes an SiON layer in accordance with an embodiment of the invention is less likely to bubble. Thus, embodiments of the invention provide an approach for forming an integrated circuit with an ILD having enhanced immunity to both HCI effects and SiON delamination problems.

Figure 4:
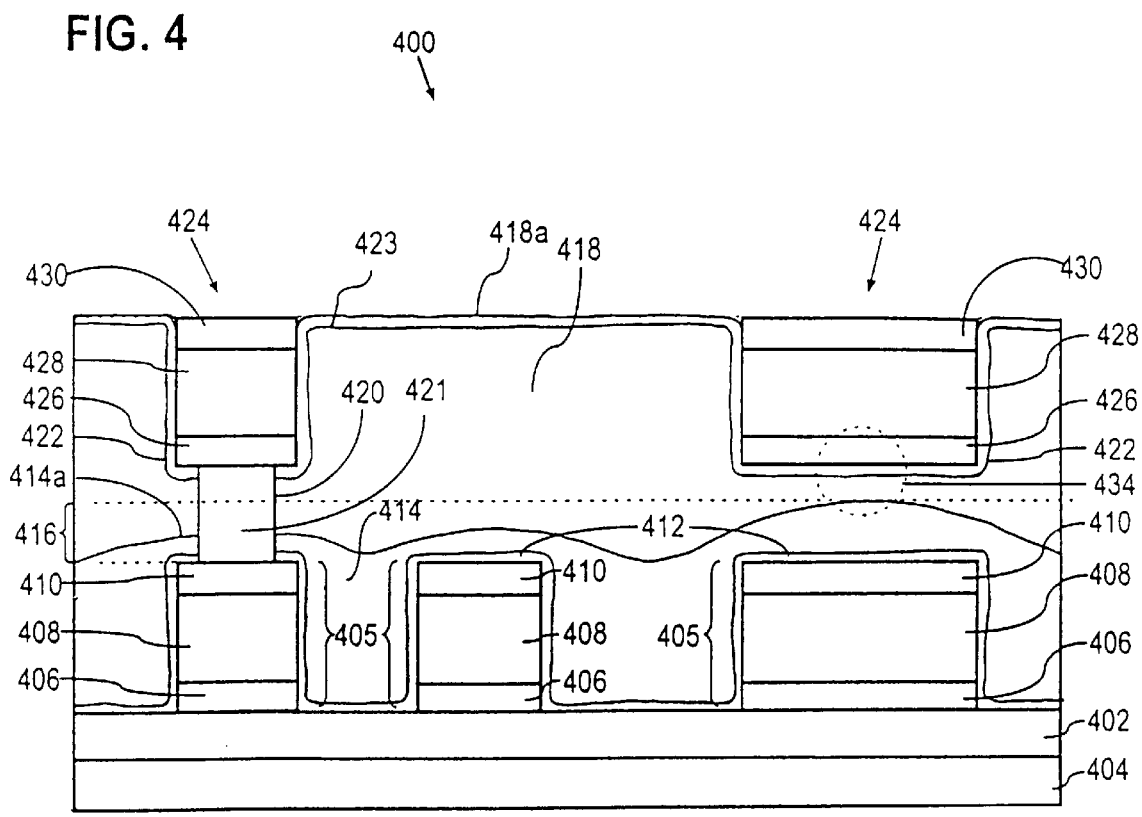
FIG. 4 schematically illustrates an integrated circuit having an ILD with a SiON film formed in accordance with another embodiment of the invention.

Embodiments of the invention are also applicable to integrated circuits that contain patterned metal layers formed using damascene processes. FIG. 4 schematically illustrates a semiconductor circuit 400 having a first patterned metal layer that is formed on top of a dielectric layer and a second patterned metal layer that is formed using semiconductor processing damascene techniques.

Semiconductor circuit 400 includes a dielectric layer 402 formed on a substrate 404. A first patterned metal layer comprising one or more metal stacks 405 is formed on dielectric layer 402. Metal stacks 405 include a barrier layer 406, typically of Ti or W, an intermediate primary conductive layer 408, typically Al, and an ARC 410, typically Ti/TiN. Metal stacks 405 are typically patterned to form metal lines.

A first lower barrier layer 412 comprising SiON is deposited on and substantially covering metal stacks 405 and dielectric layer 402. First lower barrier layer 412 may be selectively deposited to cover particular portions of metal stacks 405 and dielectric layer 402, or may be globally deposited to completely cover metal stacks 405 and dielectric layer 402. In addition, first lower barrier layer 412 may be relatively thinner than metal stacks 405 and dielectric layer 402 to form an SiON film. Thus, first lower barrier layer 412 includes gaps in between metal stacks 405. Alternatively, first lower barrier layer 412 may be made thicker to partially or completely fill the gaps between metal stacks 405.

Circuit 400 includes a dielectric gap fill layer 414, e.g., SOG, $SiO_2$ or hydrogen silsesquioxane (HSQ), formed on first lower barrier layer 412. Other low dielectric constant materials may be used for gap fill layer 414, for example FLARE or SILK. The height 416 of gap fill layer 414 on top of metal stacks 405 generally depends upon the size of metal stacks 405 and the particular process used to deposit gap fill layer 414. For example, for relatively wide metal structures, gap fill layer 414 has a thickness of about 3500 Å. On the other hand, for relatively small metal features, such as thin metal lines, the thickness of gap fill layer 414 on top of metal stacks 405 is about 400 Å to about 500 Å.

Circuit 400 also includes a cap layer 418 formed on gap fill layer 414. Cap layer 418 may be the same dielectric material as gap fill layer 414 or may be a different dielectric material. Cap layer 418 is then planarized, such as by CMP, to provide a relatively flat and smooth top surface 418a. A through-hole 420 is provided in cap layer 418, gap fill layer 414 and SiON layer 412, and filled with a conductive material, e.g. W, which is planarized, typically by CMP, to provide a conductive via 421.

A second lower barrier layer 423 is formed on cap layer 418 and in trenches 422. According to one embodiment of the invention, the final thickness of cap layer 418 is at least about 1000 Å and is ideally at least about 2000 Å.

Circuit 400 also includes a second patterned metal layer comprising one or more metal stacks 424 formed in trenches 422 and on second barrier layer 423. Metal stacks 424 include a barrier layer 426, typically of Ti or W, an intermediate primary conductive layer 428, typically Al, and an ARC 430, typically Ti/TiN. Metal stacks 424 are typically patterned to form metal lines.

Embodiments of the invention have been described (and illustrated) in the context of a single ILD. However, embodiments of the invention are applicable to semiconductor devices having any number of ILDs. For example, a particular semiconductor device may have several patterned metal layers separated by ILDs, where each ILD includes a lower barrier layer as described herein. In addition, embodiments of the inventions are applicable to semiconductor devices where one or more metal layers are formed without an SiON layer. Furthermore, embodiments of the inventions are applicable to SiON layer that are capable of transmitting ultra violet light, for example for memory applications.

The invention is applicable to the manufacture of various types of semiconductor devices, particularly ultra high density devices with sub-micron features. The invention provides several advantages over prior integrated circuit ILDs. Embodiments of the invention provide integrated circuit ILDs with SiON layers that are significantly more resistant to deformation and delamination problems during subsequent thermal process steps than conventional practices. As a result, a semiconductor device having an ILD with an SiON layer made in accordance with an embodiment of the invention exhibits greater immunity to both HCI reliability failures and SiON layer deformation and delamination problems.

In the previous description, specific details have been set forth, such as specific materials, structures, chemicals, processes, etc., in order to provide a thorough understanding of the invention. However, it will be apparent that the invention may be practiced without these specific details. In other instances, well-known processing structures have not been described in detail in order to avoid unnecessarily obscuring the invention.

In addition, although the invention has been described with reference to specific embodiments thereof, it will be evident that various modifications and changes may be made thereto without departing from the broader spirit and scope of the invention. The specification and drawings are, accordingly, to be regarded in an illustrative rather than a restrictive sense.

What is claimed is:

1. A semiconductor device comprising:

a substrate;

a dielectric layer on the substrate;

a first patterned metal layer on the dielectric layer;

a gap fill dielectric layer on the first patterned metal layer;

a dielectric cap layer on the gap fill dielectric layer;

a second patterned metal layer on the dielectric cap layer;

a conductive via between a metal feature of the first patterned metal layer and a metal feature of the second patterned metal layer; and a substantially conformal silicon oxynitride (SiON) layer on the second patterned metal layer, wherein the dielectric cap layer has a thickness of at least about 1000 Angstroms (Å) to prevent any substantial deformation and/or delamination of the substantially conformal SiON layer due to outgassing of the gap fill dielectric layer upon heating of the gap fill dielectric layer to a temperature of at least about 300° C.

2. The semiconductor device as recited in claim 1, wherein the dielectric cap layer has a thickness of at least about 2000 Å.

3. The semiconductor device as recited in claim 1, wherein the dielectric cap layer comprises a silicone oxide derived from silane or tetraethyl orthosilicate.

4. The semiconductor device as recited in claim 1, further comprising a substantially conformal SiON layer on both the first patterned metal layer and the dielectric layer.

5. The semiconductor device as recited in claim 1, wherein the gap fill dielectric layer comprises a material selected from the group consisting of spin-on-glass and hydrogen silsesquioxane.

6. The semiconductor device as recited in claim 1, wherein the conformal SiON layer has a thickness of about 500 Å to about 3000 Å.

* * * * *